(12) United States Patent
Odanaka

(10) Patent No.: US 12,489,019 B2
(45) Date of Patent: Dec. 2, 2025

(54) METHOD OF PROCESSING WAFER AND LASER APPLYING APPARATUS

(71) Applicant: DISCO CORPORATION, Tokyo (JP)

(72) Inventor: Kentaro Odanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 378 days.

(21) Appl. No.: 18/311,961

(22) Filed: May 4, 2023

(65) Prior Publication Data

US 2023/0369117 A1  Nov. 16, 2023

(30) Foreign Application Priority Data

May 12, 2022  (JP) .................................. 2022-078897

(51) Int. Cl.
| | | |
|---|---|---|
| *H01L 21/78* | (2006.01) | |
| *B23K 26/06* | (2014.01) | |
| *B23K 26/067* | (2006.01) | |
| *B23K 26/073* | (2006.01) | |
| *B23K 26/18* | (2006.01) | |
| *B23K 26/364* | (2014.01) | |
| *B23K 26/402* | (2014.01) | |
| *B23K 103/00* | (2006.01) | |
| *H01L 21/268* | (2006.01) | |

(Continued)

(52) U.S. Cl.
CPC .......... *H01L 21/78* (2013.01); *B23K 26/0665* (2013.01); *B23K 26/0676* (2013.01); *B23K 26/0736* (2013.01); *B23K 26/18* (2013.01); *B23K 26/364* (2015.10); *B23K 26/402* (2013.01); *H01L 21/268* (2013.01); *H01L 21/3043* (2013.01); *H01L 21/3065* (2013.01); *H01L 21/67115* (2013.01); *H01L 23/544* (2013.01); *B23K 2103/56* (2018.08); *H01L 2223/5446* (2013.01)

(58) Field of Classification Search
None
See application file for complete search history.

(56) References Cited

U.S. PATENT DOCUMENTS

| | | | |
|---|---|---|---|
| 2005/0035100 A1* | 2/2005 | Genda .................... | B28D 5/022 219/121.72 |
| 2005/0101108 A1* | 5/2005 | Genda .................... | H01L 21/78 257/E21.599 |

(Continued)

FOREIGN PATENT DOCUMENTS

JP  2005064231 A  3/2005

*Primary Examiner* — Erik T. K. Peterson
(74) *Attorney, Agent, or Firm* — Greer Burns & Crain Ltd.

(57) ABSTRACT

A method of processing a wafer includes removing a functional layer on projected dicing lines, thereby exposing a substrate, and cutting the wafer along the projected dicing lines where the substrate is exposed, thereby fabricating individual device chips. A laser applying apparatus includes a beam branching unit for branching a laser beam spot into at least two slender spots spaced from each other in a processing direction along the projected dicing lines, and orienting longer sides of the slender spots transversely across the projected dicing lines and shorter sides of the slender spots in the processing direction. A wafer region processed by the laser beams is expanded by moving the at least two slender spots from the beam branching unit in such a manner as to make the longer sides of the slender spots shifted in opposite directions transversely across the projected dicing lines.

4 Claims, 5 Drawing Sheets

(51) Int. Cl.
*H01L 21/304* (2006.01)
*H01L 21/3065* (2006.01)
*H01L 21/67* (2006.01)
*H01L 23/544* (2006.01)

(56) References Cited

U.S. PATENT DOCUMENTS

2006/0148211 A1* 7/2006 Iwasaki ............... H01L 21/78
                                              257/E21.599
2009/0191693 A1* 7/2009 Iizuka ................ H01L 21/78
                                              257/E21.349
2016/0315010 A1* 10/2016 Van Der Stam ... B23K 26/0676
2019/0389008 A1* 12/2019 Furuta ............... B23K 26/0648
2023/0264292 A1* 8/2023 Aikawa ............. B23K 26/0676
                                              219/121.72

\* cited by examiner

B-B

METHOD OF PROCESSING WAFER AND LASER APPLYING APPARATUS

BACKGROUND OF THE INVENTION

Field of the Invention

The present invention relates to a method of processing a wafer having a semiconductor substrate and a functional layer disposed on an upper surface of the semiconductor substrate, the wafer including a plurality of devices disposed in respective areas of the functional layer that are demarcated on a face side of the wafer by a plurality of intersecting projected dicing lines, to divide the wafer into individual device chips including the respective devices, and a laser applying apparatus for removing the functional layer of such a wafer along the projected dicing lines.

Description of the Related Art

Wafers having a plurality of devices such as integrated circuits (ICs) and large-scale integrated (LSI) circuits that are disposed in respective areas demarcated on a face side of the wafer by a plurality of intersecting projected dicing lines are divided into individual device chips by a dicing apparatus having a rotatable cutting blade. The device chips produced from the wafers will be used in electronic appliances such as cellular phones and personal computers.

Some wafers include an insulating film having a low dielectric constant, which is also referred to as a low-k film, the insulating film being disposed as a functional layer on an upper surface of a semiconductor substrate, and a plurality of devices included in the functional layer. When such a wafer is cut along projected dicing lines by a cutting blade, the low-k film is liable to peel off like mica flakes from the place where it is cut by the cutting blade, tending to cause damage to the devices.

The applicant of the present invention has proposed a technology in which a low-k film layered on projected dicing lines on a semiconductor substrate is removed by a laser beam applied thereto, to expose the semiconductor substrate, and the semiconductor substrate is then cut by a cutting blade along the projected dicing lines from which the low-k film has been removed, so that the low-k film is prevented from peeling off from the place where the semiconductor substrate is cut by the cutting blade (see, for example, JP 2005-064231A).

SUMMARY OF THE INVENTION

FIG. 7 of the accompanying drawings illustrates prior art relevant to the present invention. According to the illustrated prior art, a laser beam LB0 having a spot diameter P0 commensurate with the width of a projected dicing line 210 on a wafer 200 is repeatedly applied in a desired number of passes to the wafer 200 along a processing direction, i.e., a direction normal to the sheet of FIG. 7, which corresponds to the longitudinal directions of the projected dicing line 210, to remove a functional layer 220 including a low-k film disposed on the projected dicing line 210, thereby forming a groove 230 along the projected dicing line 210 where a semiconductor substrate is exposed. When the groove 230 is thus formed, deep ditches 232 each having a downwardly pointed sharp lower end as viewed in cross section are formed in the semiconductor substrate on transversely opposite sides of the groove 230 along the projected dicing line 210. The ditches 232 with the downwardly pointed sharp lower ends are likely to lower the flexural strength and hence the quality of individual device chips to be produced from the wafer 200.

It is therefore an object of the present invention to provide a method of processing a wafer by applying a laser beam to the wafer in a processing direction along projected dicing lines to remove a functional layer disposed on the projected dicing lines, thereby exposing a semiconductor substrate, without forming deep grooves each having a downwardly pointed sharp lower end as viewed in cross section in the semiconductor substrate, on transversely opposite sides of the projected dicing lines, so that the quality of individual device chips to be produced from the wafer will not be lowered, and a laser applying apparatus for carrying out the method of processing a wafer.

In accordance with an aspect of the present invention, there is provided a method of processing a wafer having a semiconductor substrate and a functional layer disposed on an upper surface of the semiconductor substrate, the wafer including a plurality of devices disposed in respective areas of the functional layer that are demarcated on a face side of the wafer by a plurality of intersecting projected dicing lines, to divide the wafer into individual device chips including the respective devices. The method includes a functional layer removing step of removing the functional layer disposed on the projected dicing lines, thereby exposing the semiconductor substrate, and a device chip fabricating step of cutting the wafer along the projected dicing lines where the semiconductor substrate is exposed, thereby fabricating individual device chips. The functional layer removing step includes a removing step of removing the functional layer by applying laser beams to the projected dicing lines with use of a laser applying apparatus that has a laser oscillator for emitting a laser beam, a beam condenser for condensing the laser beam emitted from the laser oscillator into a spot smaller than a width of the projected dicing lines and for positioning the spot on the projected dicing lines, a beam spot shaper disposed between the laser oscillator and the beam condenser and configured to shape the spot into a slender spot, and a beam branching unit for branching the slender spot into at least two slender spots spaced from each other in a processing direction along the projected dicing lines and for orienting longer sides of the slender spots transversely across the projected dicing lines and shorter sides of the slender spots in the processing direction, and an expanding step of expanding a wafer region processed by the laser beams, by moving the at least two slender spots from the beam branching unit in such a manner as to make the longer sides of the slender spots shifted in opposite directions transversely across the projected dicing lines. The removing step and the expanding step are repetitively carried out to remove the functional layer on the projected dicing lines.

Preferably, the method of processing a wafer further includes a width limiting groove forming step of, prior to the functional layer removing step, forming two grooves for limiting the width of the projected dicing lines, by applying the laser beams to the projected dicing lines. Preferably, the method of processing a wafer further includes a protective film coating step of, prior to the functional layer removing step and the width limiting groove forming step, coating the face side of the wafer with a protective film. Preferably, the device chip fabricating step includes any one of a step of cutting the wafer along the projected dicing lines with a cutting blade, a step of cutting the wafer along the projected dicing lines with a laser beam, and a step of cutting the wafer along the projected dicing lines by plasma etching.

In accordance with another aspect of the present invention, there is provided a laser applying apparatus for removing a functional layer of a wafer along projected dicing lines with a laser beam applying unit, the wafer having a semiconductor substrate with the functional layer disposed on an upper surface thereof, the wafer including a plurality of devices disposed in respective areas of the functional layer that are demarcated on a face side of the wafer by the intersecting projected dicing lines. The laser beam applying unit includes a laser oscillator for emitting a laser beam, a beam condenser for condensing the laser beam emitted from the laser oscillator into a spot smaller than a width of the projected dicing lines and for positioning the spot on the projected dicing lines, a beam spot shaper disposed between the laser oscillator and the beam condenser and configured to shape the spot into a slender spot, and a beam branching unit for branching the slender spot into at least two slender spots spaced from each other in a processing direction along the projected dicing lines and for orienting longer sides of the slender spots transversely across the projected dicing lines and shorter sides of the slender spots in the processing direction.

The method of processing a wafer according to the present invention can process the wafer while gradually expanding the wafer region processed by the laser beams transversely across the projected dicing lines, so that the wafer is prevented from being too intensively processed and is evenly processed on both sides of the spots transversely across the projected dicing lines, and hence is prevented from having deep ditches each having a downwardly pointed sharp lower end, on both sides of the projected dicing line. Consequently, the device chip fabricating step performed in the groove does not lower the flexural strength and hence the quality of individual device chips to be produced from the wafer.

The laser applying apparatus according to the present invention includes the spot shaper disposed between the laser oscillator and the beam condenser and configured to shape the spot into a slender spot, and the beam branching unit for branching the slender spot into at least two slender spots spaced from each other in a processing direction along the projected dicing lines and for orienting longer sides of the slender spots transversely across the projected dicing lines and shorter sides of the slender spots in the processing direction. Therefore, the laser applying apparatus can process the wafer while gradually expanding the wafer region processed by the laser beams transversely across the projected dicing lines, so that the wafer is prevented from being too intensively processed and is evenly processed on both sides of the spots transversely across the projected dicing lines, and hence is prevented from having deep ditches each having a downwardly pointed sharp lower end, on both sides of the projected dicing line.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A method of processing a wafer according to a preferred embodiment of the present invention and a laser applying apparatus suitable for performing a functional layer removing step of the method of processing a wafer will be described in detail below with reference to the accompanying drawings.

Figure 1:
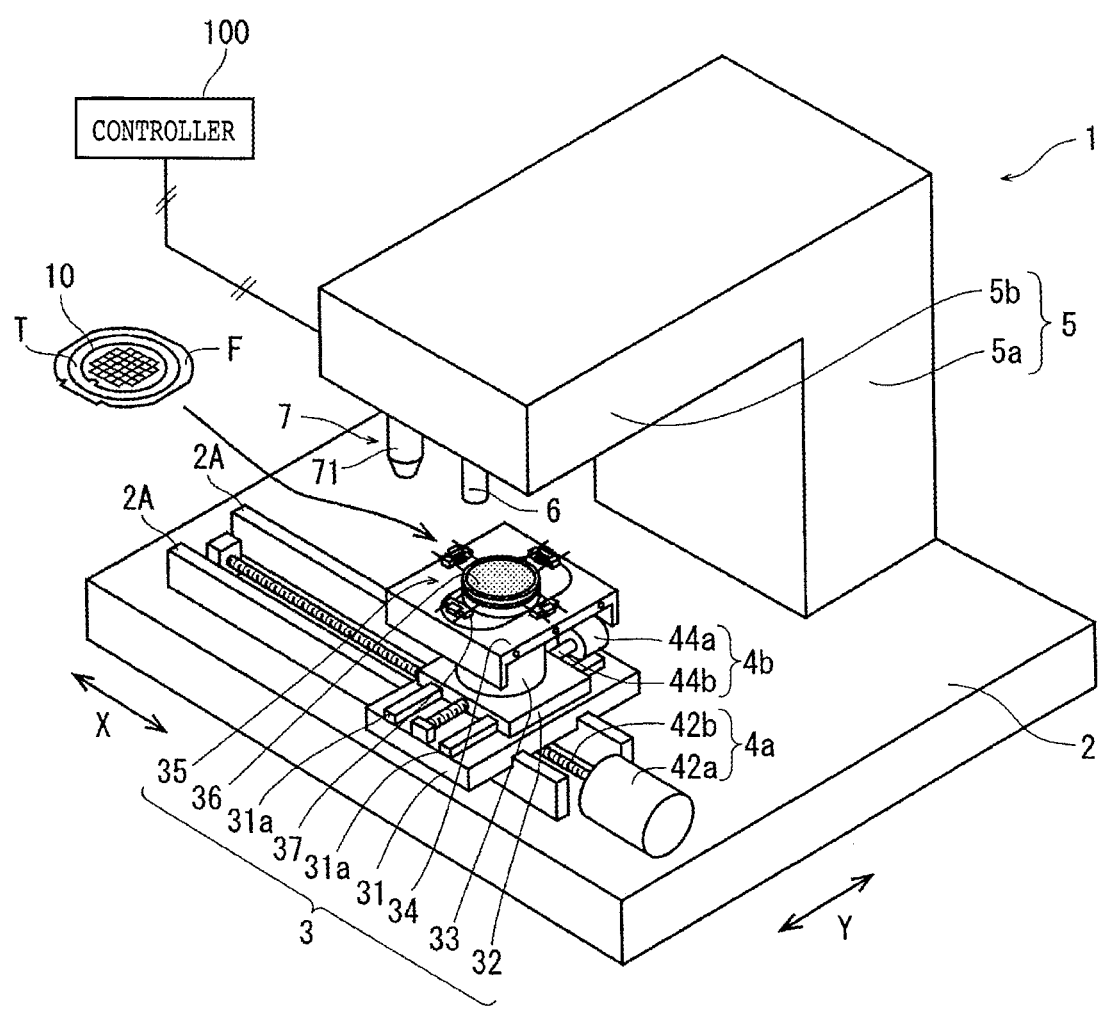
FIG. 1 is a perspective view of a laser applying apparatus according to an embodiment of the present invention.

The method of processing a wafer according to the present embodiment includes a functional layer removing step and a device chip fabricating step. The functional layer removing step is a step of removing a functional layer on a plurality of intersecting projected dicing lines, the functional layer being disposed on an upper surface of a semiconductor substrate of a wafer, the wafer including a plurality of devices disposed in respective areas of the functional layer that are demarcated on a face side of the wafer by the projected dicing lines, thereby exposing the semiconductor substrate along the projected dicing lines. The device chip fabricating step is a step of fabricating individual device chips including the respective devices, by cutting the wafer along the projected dicing lines where the semiconductor substrate is exposed. FIG. 1 illustrates in perspective a laser applying apparatus 1 suitable for carrying out not only the functional layer removing step but also a width limiting groove forming step, which is to be described later, of the method of processing a wafer according to the present embodiment.

As illustrated in FIG. 1, the laser applying apparatus 1 is an apparatus for processing, with a laser beam, a wafer 10 held on an annular frame F by a protective tape T. The laser applying apparatus 1 includes a base 2 and a laser beam applying unit 7 that is mounted on the base 2 and that applies a laser beam to the wafer 10.

The laser applying apparatus 1 includes, in addition to the laser beam applying unit 7, a holding unit 3 for holding the wafer 10 thereon, a positioning unit 6 for capturing an image of the wafer 10 held on the holding unit 3 and performing a positioning step on the basis of the captured image, an X-axis moving mechanism 4a that is mounted on the base 2 and that moves the holding unit 3 along an X-axis indicated by an arrow X, a Y-axis moving mechanism 4b that is mounted on the X-axis moving mechanism 4a and that moves the holding unit 3 along a Y-axis indicated by an arrow Y which is perpendicular to the X-axis, a frame 5 that includes a vertical wall 5a erected on the base 2 sideways of the X-axis moving mechanism 4a and the Y-axis moving mechanism 4b and a horizontal beam 5b extending horizontally from an upper end portion of the vertical wall 5a in overhanging relation to the holding unit 3, and a controller 100 for controlling the various operative components of the laser applying apparatus 1.

The holding unit 3 is means for holding the wafer 10 on a holding surface lying in an XY plane which is defined by X coordinates along the X-axis and Y-coordinates along the Y-axis. As illustrated in FIG. 1, the holding unit 3 includes a rectangular X-axis movable plate 31 that is mounted on the base 2 movably along the X-axis, a rectangular Y-axis movable plate 32 that is mounted on the X-axis movable plate 31 movably along the Y-axis, a hollow cylindrical support post 33 that is fixedly mounted on an upper surface of the Y-axis movable plate 32, and a rectangular cover plate 34 that is fixedly mounted on an upper end of the support post 33. A chuck table 35 extends upwardly through an oblong hole defined in the cover plate 34, and is rotatable about its central axis by a rotating mechanism, not illustrated, housed in the support post 33. The chuck table 35 has an upper surface on which there is disposed a circular suction chuck 36 made of an air-permeable porous material and providing the holding surface referred to above. The suction chuck 36 is fluidly connected to suction means, not illustrated, through a fluid channel, not illustrated, defined in the support post 33. When the wafer 10 is placed on the suction chuck 36, the suction means is actuated, generating and transmitting suction forces, i.e., a negative pressure, through the fluid channel to the suction chuck 36, thereby holding the wafer 10 under suction on the holding surface of the suction chuck 36. Four clamps 37 are disposed at equally spaced intervals around the suction chuck 36 and grip an annular frame F that supports the wafer 10, when the wafer 10 is held on the chuck table 35.

The X-axis moving mechanism 4a converts rotary motion of an electric motor 42a through a ball screw 42b into linear motion, which is transmitted to the X-axis movable plate 31, thereby moving the X-axis movable plate 31 along the X-axis along a pair of guide rails 2A mounted on the base 2 and extending along the X-axis. The Y-axis moving mechanism 4b converts rotary motion of an electric motor 44a through a ball screw 44b into linear motion, which is transmitted to the Y-axis movable plate 32, thereby moving the Y-axis movable plate 32 along the Y-axis along a pair of guide rails 31a mounted on the X-axis movable plate 31 and extending along the Y-axis.

The horizontal beam 5b of the frame 5 houses therein an optical system of the laser beam applying unit 7 and supports the positioning unit 6 thereon. The laser beam applying unit 7 includes a beam condenser 71 disposed on a lower surface of a distal end portion of the horizontal beam 5b. The beam condenser 71 converges and applies a laser beam generated by the laser beam applying unit 7 to the wafer 10 held on the chuck table 35. The positioning unit 6 is means for capturing an image of the wafer 10 held on the chuck table 35 and detecting the position and orientation of the wafer 10 and a processing position where the wafer 10 is to be processed by the laser beam, on the basis of the captured image. The positioning unit 6 is disposed on the lower surface of the distal end portion of the horizontal beam 5b at a position that is adjacent to the beam condenser 71 along the X-axis.

Figure 2:
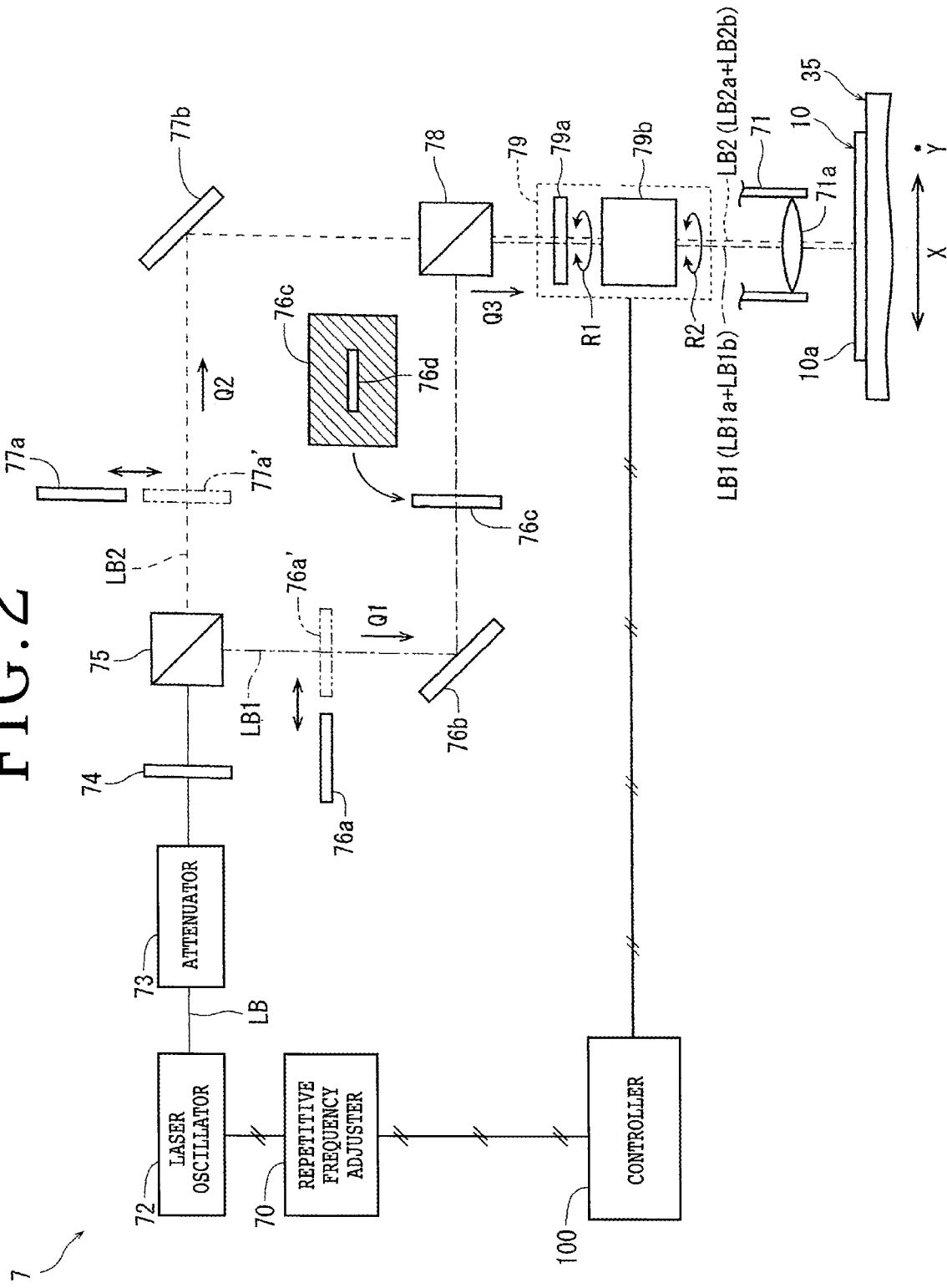
FIG. 2 is a block diagram illustrating a general makeup of an optical system of a laser beam applying unit in the laser applying apparatus illustrated in FIG. 1.

FIG. 2 illustrates in block form a general makeup of the optical system of the laser beam applying unit 7. The laser beam applying unit 7 includes a laser oscillator 72 for emitting a laser beam LB, a repetitive frequency adjuster 70 for adjusting the repetitive frequency of the laser beam LB to be emitted from the laser oscillator 72 to a desired frequency, an attenuator 73 for adjusting the output level of the laser beam LB emitted from the laser oscillator 72, a first half-wave plate 74 for rotating the polarization direction of the laser beam LB that is linearly polarized from the attenuator 73, a first beam splitter 75 for directing, to a beam route Q1, a laser beam LB1 (indicated by the dot-and-dash line) that has been S-polarized because the polarization direction thereof has been rotated by the first half-wave plate 74, and also directing, to a beam route Q2, a laser beam LB2 (indicated by the broken line) that has been P-polarized, and a second beam splitter 78 for selectively directing the laser beam LB1 from the first beam route Q1 and the laser beam LB2 from the second beam route Q2 to a condensing beam route Q3.

The first beam route Q1 includes a first shutter 76a for selectively passing and interrupting the laser beam LB1 from the first beam splitter 75, a beam spot shaper 76c having a slit 76d for shaping the spot of the laser beam LB1 into a slender shape, and a reflecting mirror 76b for changing the optical path of the laser beam LB1.

The second beam route Q2 includes a second shutter 77a for selectively passing and interrupting the laser beam LB2 from the first beam splitter 75 and a reflecting mirror 77b for changing the optical path of the laser beam LB2.

The condensing beam route Q3 includes a beam branching unit 79 and a condensing lens 71a of the beam condenser 71. The beam branching unit 79 has a second half-wave plate 79a for rotating the polarization direction of a linearly polarized laser beam applied thereto and a Wollaston prism 79b for branching the applied laser beam into two laser beams such that each laser beam has an output level that is ½ of the applied laser beam, to form two beam spots spaced from each other in desired directions. The Wollaston prism 79b is generally known as a polarizing prism for separating an applied light beam into two orthogonal linearly polarized light beams, and will not be described in detail below. The beam branching unit 79 includes a rotating mechanism, not illustrated, that is electrically connected to the controller 100 and that rotates the second half-wave plate 79a in the directions indicated by an arrow R1 and also rotates the Wollaston prism 79b in the directions indicated by an arrow R2 accurately through respective desired angles.

The controller 100 is a computer and includes a central processing unit (CPU) for performing processing operations according to control programs, a read only memory (ROM) for storing the control programs, etc., a read-write random access memory (RAM) for temporarily storing detected values, processed results, etc., an input interface, and an output interface. Details of these components of the controller 100 are omitted from illustration. The controller 100 is electrically connected to the positioning unit 6, the repetitive frequency adjuster 70, the beam branching unit 79, the first shutter 76a, the second shutter 77a, the X-axis moving mechanism 4a, the Y-axis moving mechanism 4b, etc., though some of the electric connections are omitted from illustration. Information detected from the image captured by the positioning unit 6 is stored in a suitable memory and displayed on a display unit, not illustrated.

The laser applying apparatus 1 according to the present embodiment is constructed and configured as described above. The functional layer removing step and the device chip fabricating step of the method of processing a wafer according to the present embodiment that is carried out by using the laser applying apparatus 1 will be described below. The method of processing a wafer to be described below also includes a width limiting groove forming step that is carried out prior to the functional layer removing step. The width limiting groove forming step is a step of forming two grooves that limit the width of a projected dicing line, by applying the laser beam to the wafer 10.

Figure 3:
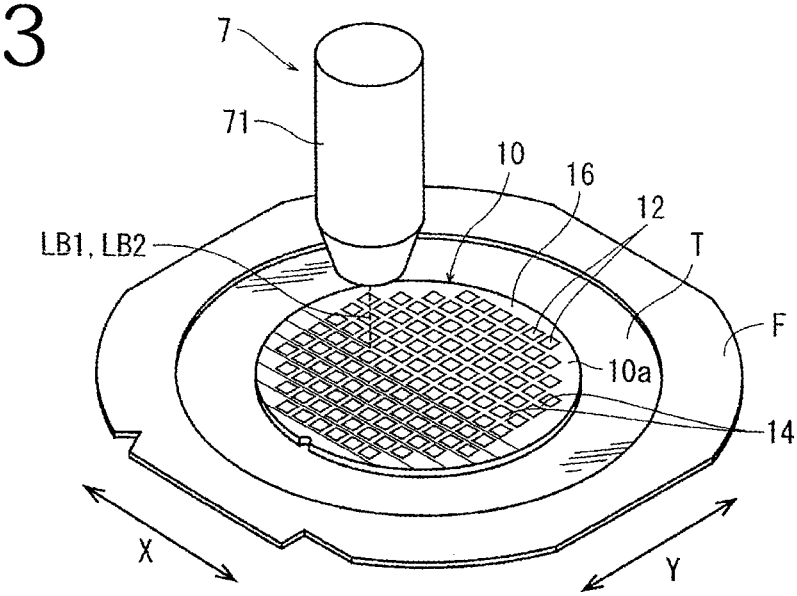
FIG. 3 is a perspective view of a wafer to be processed by a method of processing a wafer according to the embodiment, the view illustrating the manner in which the wafer is processed.

The wafer 10 that is to be processed by the method according to the present embodiment is illustrated by way of example in FIG. 3. The wafer 10 includes a semiconductor substrate 15 (see FIG. 4C) such as a substrate made of silicon (Si) and a functional layer 16 disposed on an upper surface of the semiconductor substrate 15. The wafer 10 includes a plurality of devices 12 constructed in respective areas of the functional layer 16 that are demarcated on a face side 10a of the wafer 10 by a plurality of intersecting projected dicing lines 14. The wafer 10 has a diameter of 200 mm and a thickness of 700 μm, for example. The functional layer 16 has a thickness of 10 μm, for example. Each of the projected dicing lines 14 has a width of 70 μm, for example. The functional layer 16 is an interlayer insulating film such as an insulating film having a low dielectric constant, i.e., a low-k film, which may include an inorganic film such as SiOF or BSG(SiOB) or an organic film such as a polyimide-based or parylene-based polymer film, and is disposed on the upper surface of the semiconductor substrate 15 in order to increase the processing capability of the devices 12 of the wafer 10. The structure of the interlayer insulating film is adjusted appropriately depending on the kind of the devices 12. As illustrated in FIG. 3, the wafer 10 is disposed in a circular opening of the annular frame F (see also FIG. 1) and supported on the annular frame F by an adhesive tape T, which is illustrated as the protective tape T in FIG. 1, the wafer 10 being affixed to the adhesive tape T.

The method of processing a wafer according to the present invention should preferably, but not necessarily, include a protective film coating step of coating the face side 10a of the wafer 10 with a protective film in order to prevent debris, swarf, etc., scattered around in the functional layer removing step and the device chip fabricating step from being deposited on the face side 10a of the wafer 10. The protective film may be formed, for example, by dropping a liquid resin onto the face side 10a of the wafer 10 and rotating the wafer 10 at a high speed to cause the liquid resin to spread over the face side 10a or by covering the face side 10a with a protective sheet of resin that is commensurate in shape with the wafer 10.

When the wafer 10 of the above structure has been prepared, it is placed on the chuck table 35 of the laser applying apparatus 1, held under suction on the suction chuck 36 by the suction means, not illustrated, and secured in position by the clamps 37 that grip the annular frame F. Then, the X-axis moving mechanism 4a and the Y-axis moving mechanism 4b are actuated to position the wafer 10 directly below the positioning unit 6, as illustrated in FIG. 1. Then, the positioning unit 6 captures an image of the wafer 10, and on the basis of the captured image, the rotating mechanism, not illustrated, rotates the chuck table 35 to align those projected dicing lines 14 that extend in a first direction with the X-axis and those projected dicing lines 14 that extend in a second direction perpendicular to the first direction with the Y-axis. Then, positional information defined by the X and Y coordinates of a projected dicing line 14 along which to process the wafer 10 is stored in the controller 100.

In the method according to the present embodiment, prior to the functional layer removing step, the width limiting groove forming step of forming two grooves that limit the width of a projected dicing line 14, by applying a laser beam to the wafer 10, is carried out as follows.

In the width limiting groove forming step, as illustrated in FIG. 2, the first shutter 76a is moved to a first shutter position 76a' indicated by the broken lines across the first beam route Q1, thereby closing the first beam route Q1, and the second shutter 77a is moved to a position indicated by the solid lines away from the second beam route Q2, thereby opening the second beam route Q2. Then, the X-axis moving mechanism 4a and the Y-axis moving mechanism 4b are actuated to place a laser processing start position on a predetermined projected dicing line 14 extending in the first direction, directly below the beam condenser 71 of the laser beam applying unit 7.

Figure 4A:
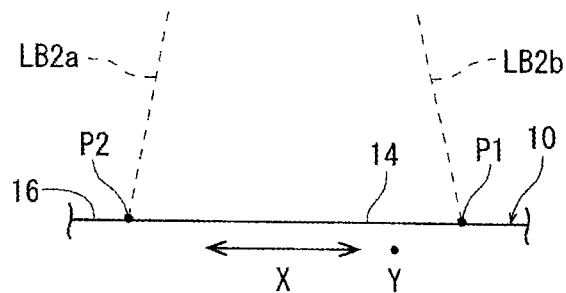
FIG. 4A is a side elevational view illustrating the manner in which a width limiting groove forming step of the method is carried out.
Figure 4B:
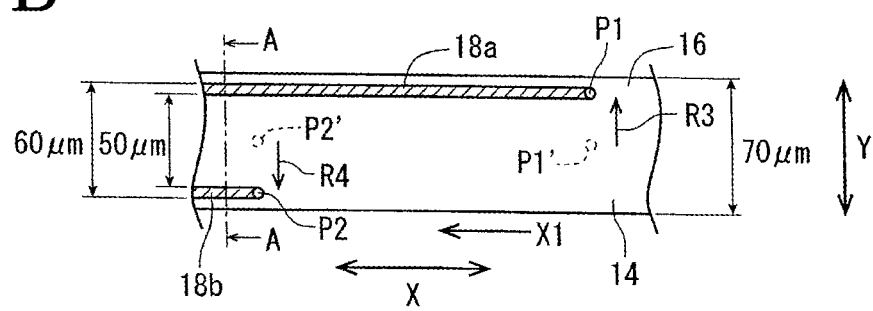
FIG. 4B is a plan view of the manner illustrated in FIG. 4A.

Then, the laser oscillator 72 of the laser beam applying unit 7 is energized to emit a laser beam LB that has a wavelength absorbable by the functional layer 16 and the semiconductor substrate 15 of the wafer 10. The emitted laser beam LB is applied to the attenuator 73, from which the laser beam LB is applied to the first half-wave plate 74. The first half-wave plate 74 rotates the polarization direction of the laser beam LB, and the laser beam LB whose polarization direction has been rotated is applied to the first beam splitter 75. The first beam splitter 75 passes and introduces a P-polarized laser beam LB2 into the second beam route Q2. At this time, since the first beam route Q1 is closed, a leakage laser beam that may have leaked from the first beam splitter 75 into the first beam route Q1 is interrupted by the first shutter 76a in the first shutter position 76a'. The laser beam LB2 that has been introduced into the second beam route Q2 has its optical path changed by the reflecting mirror 77b, and is introduced through the second beam splitter 78 into the beam branching unit 79. When the laser beam LB2 is introduced into the beam branching unit 79, as described above with reference to FIG. 2, the second half-wave plate 79a of the beam branching unit 79 is rotated in the directions indicated by the arrow R1, rotating the polarization direction of the linearly polarized laser beam, which then reaches the Wollaston prism 79b. The Wollaston prism 79b is rotated in the directions indicated by the arrow R2 in unison with the second half-wave plate 79a, branching the laser beam into a P-polarized laser beam LB2a and an S-polarized laser beam LB2b, each having an output level that is ½ of the applied laser beam, as illustrated in FIG. 4A. The P-polarized laser beam LB2a and the S-polarized laser beam LB2b are applied from the beam condenser 71 (see FIG. 3) respectively as a spot P1 and a spot P2, each having a diameter of 5 μm, to the functional layer 16 on the projected dicing line 14, as illustrated in FIGS. 4A and 4B.

The distance between the two spots P1 and P2 transversely across the projected dicing line 14 is established by the rotation of the beam branching unit 79 to match a width of 60 μm by which the functional layer 16 on the projected dicing line 14 is to be removed. For example, as illustrated in FIG. 4B, the distance between the two spots P1 and P2 transversely across the projected dicing line 14 may be adjusted to a desired width by moving the spots P1 and P2 respectively from spots P1' and P2' in the respective directions indicated by arrows R3 and R4.

Figure 4C:
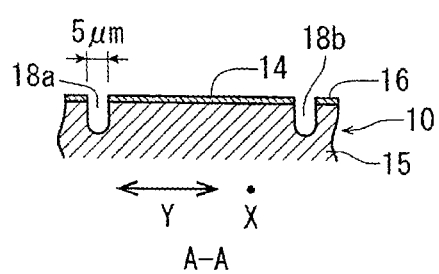
FIG. 4C is an enlarged cross-sectional view taken along a line A-A of FIG. 4B.

Then, the repetitive frequency adjuster 70 adjusts the repetitive frequency of the laser beam LB to be emitted from the laser oscillator 72, to a desired frequency, and the laser oscillator 72 emits the laser beam LB whose repetitive frequency has been adjusted. The X-axis moving mechanism 4a is actuated to move, i.e., processing-feed, the chuck table 35 and hence the wafer 10 thereon in the direction indicated by an arrow X1 (see FIG. 4B) along the X-axis, while at the same time the P-polarized laser beam LB2a and the S-polarized laser beam LB2b are repetitively applied in three passes, for example, to the projected dicing line 14. The P-polarized laser beam LB2a and the S-polarized laser beam LB2b thus applied to the projected dicing line 14 remove strips of the functional layer 16 and form two grooves 18a and 18b in the semiconductor substrate 15, as illustrated in FIGS. 4B and 4C. According to the present embodiment, as illustrated in FIG. 4B, whereas the projected dicing line 14 has a width of 70 µm, the grooves 18a and 18b have respective outer edges spaced from each other by a distance of 60 µm and respective inner edges spaced from each other by a distance of 50 µm.

The above laser processing operation is performed on all the projected dicing lines 14 on the face side 10a of the wafer 10 by appropriately actuating the laser beam applying unit 7, the X-axis moving mechanism 4a, the Y-axis moving mechanism 4b, and the rotating mechanism, not illustrated, for rotating the chuck table 35, thereby forming the two grooves 18a and 18b in all the projected dicing lines 14. The width limiting groove forming step is carried out as described above.

Laser processing conditions in the width limiting groove forming step are as follows, for example.
Wavelength: 355 nm
Repetitive frequency: 1000 kHz
Average output level: 0.8 W
Pulse duration: 10 ps
Processing feed speed: 300 mm/s After the width limiting groove forming step has been carried out, the functional layer removing step is carried out as follows.

The functional layer removing step is a step of removing the functional layer 16 on the projected dicing lines 14, exposing the semiconductor substrate 15. In the functional layer removing step, as illustrated in FIG. 2, the second shutter 77a is moved to a second shutter position 77a' indicated by the broken lines across the second beam route Q2, thereby closing the second beam route Q2, and the first shutter 76a is moved to a position indicated by the solid lines away from the first beam route Q1, thereby opening the first beam route Q1. The laser beam LB emitted from the laser oscillator 72 is applied to the first half-wave plate 74, which rotates the polarization direction of the linearly polarized laser beam. The first beam splitter 75 directs an S-polarized laser beam LB1 of the linearly polarized laser beam to the first beam route Q1. The laser beam LB1 introduced into the first beam route Q1 is reflected by the reflecting mirror 76b to travel to the beam spot shaper 76c that functions as a mask. The laser beam LB1 applied to the beam spot shaper 76c is shaped into a slender spot having a shorter side and a longer side, by the slit 76d defined in the beam spot shaper 76c. The laser beam LB1 thus shaped by the beam spot shaper 76c is applied to the second beam splitter 78 and introduced thereby into the beam branching unit 79 and the beam condenser 71 in the condensing beam route Q3.

Figure 5A:
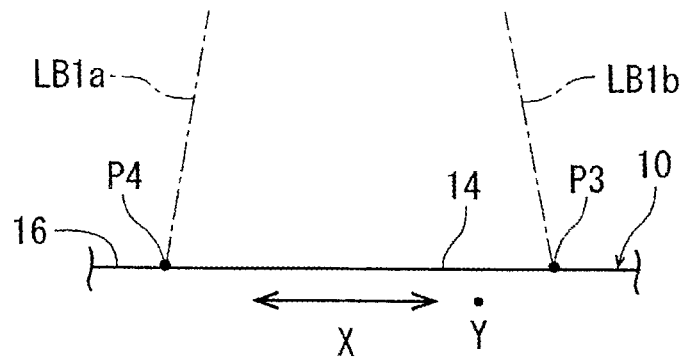
FIG. 5A is a side elevational view illustrating the manner in which a functional layer removing step of the method is carried out.
Figure 5B:
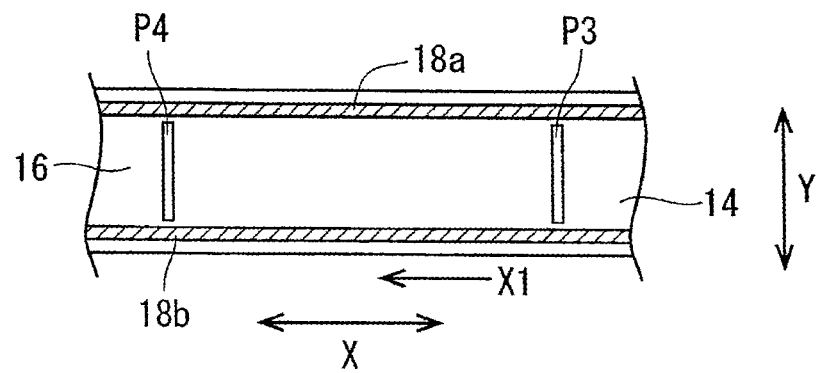
FIG. 5B is a plan view of an initial state of the manner illustrated in FIG. 5A.

With the laser beam applying unit 7 being thus configured, the X-axis moving mechanism 4a and the Y-axis moving mechanism 4b are actuated to place a laser processing start position on a predetermined projected dicing line 14 extending in the first direction directly below the beam condenser 71 of the laser beam applying unit 7. Then, the laser oscillator 72 emits a laser beam LB whose repetitive frequency has been adjusted to a desired frequency by the repetitive frequency adjuster 70. When the laser beam LB1 is introduced from the first beam route Q1 into the beam branching unit 79, as described above with reference to FIG. 2, the second half-wave plate 79a of the beam branching unit 79 is rotated, rotating the polarization direction of the linearly polarized laser beam, which then reaches the Wollaston prism 79b of the beam branching unit 79. The Wollaston prism 79b is rotated, branching the laser beam LB1 into a P-polarized laser beam LB1a and an S-polarized laser beam LB1b, each having an output level that is ½ of the applied laser beam, as illustrated in FIG. 5A. The P-polarized laser beam LB1a and the S-polarized laser beam LB1b are applied from the beam condenser 71 respectively as a spot P3 and a spot P4, each of which is shorter than the width of the projected dicing line 14, to the functional layer 16 on the projected dicing line 14, as illustrated in FIGS. 5A and 5B. The spots P3 and P4 are spaced from each other in the processing direction along the projected dicing line 14, i.e., along the X-axis.

The spots P3 and P4 that are formed respectively by the P-polarized laser beam LB1a and the S-polarized laser beam LB1b, which are applied to the projected dicing line 14, have longer sides oriented transversely across the projected dicing line 14 along the Y-axis and shorter sides oriented in the processing direction along the projected dicing line 14, i.e., along the X-axis, as illustrated in FIG. 5B. In an initial state, as illustrated in FIG. 5B, the spots P3 and P4 are positioned transversely centrally on the projected dicing line 14 and extend parallel to each other. According to the present embodiment, the shorter side of each of the spots P3 and P4 is 6 µm long, and the longer side thereof is 45 µm long. Especially, the longer side is shorter than the distance (60 µm) between the outer edges of the two grooves 18a and 18b, or preferably shorter than the distance (50 µm) between the inner edges of the two grooves 18a and 18b. The spots P3 and P4 are spaced from each other by a distance of 250 µm along the X-axis.

While the P-polarized laser beam LB1a and the S-polarized laser beam LB1b are applied to the predetermined projected dicing line 14 extending in the first direction, the X-axis moving mechanism 4a is actuated to move, i.e., processing-feed, the chuck table 35 and hence the wafer 10 thereon in the direction indicated by the arrow X1 (see FIG. 5B) along the X-axis, thereby performing a removing step of removing the functional layer 16 on the projected dicing line 14 with the spots P3 and P4. According to the present embodiment, laser processing conditions are established such that the functional layer 16 will not fully be removed in one removing step. The removing step is repetitively carried out in eight passes, for example, i.e., the P-polarized laser beam LB1a and the S-polarized laser beam LB1b are repetitively applied in eight passes, for example, to the projected dicing line 14 until the spots P3 and P4 form a groove 19 (see FIG. 5D) in the wafer 10 along the projected dicing line 14 deep enough to fully remove the functional layer 16 and expose the semiconductor substrate 15.

Figure 5C:
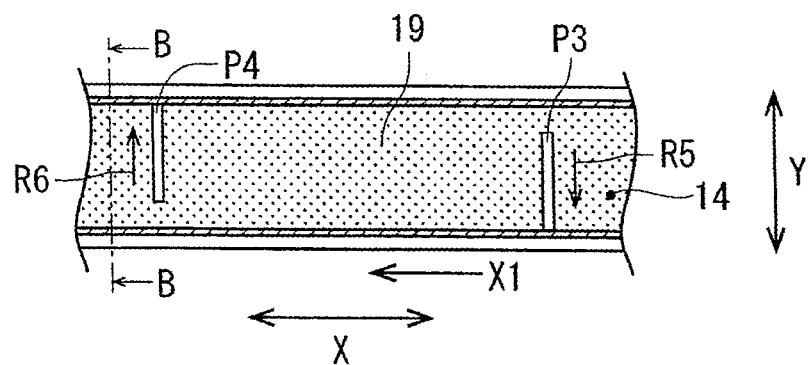
FIG. 5C is a plan view of a state in which the manner illustrated in FIG. 5A is completed.

In the functional layer removing step according to the present embodiment, while the above removing step is carried out, an expanding step to be described below is also carried out at the same time. As descried above, in the initial state, the spots P3 and P4 are positioned transversely centrally on the projected dicing line 14 such that their Y coordinates are aligned with each other at the positions spaced in the processing direction along the X-axis, i.e., do not differ from each other transversely across the projected dicing line 14. Thereafter, each time the removing step is carried out, the Wollaston prism 79*b* of the beam branching unit 79 is slightly rotated, and the second half-wave plate 79*a* is rotated in unison therewith, moving the two spots P3 and P4 small distances in the respective directions indicated by arrows R5 and R6 in FIG. 5C, in such a manner that the longer sides of the two spots P3 and P4 branched from the laser beam LB1 are shifted in opposite directions transversely across the projected dicing line 14.

Figure 5D:
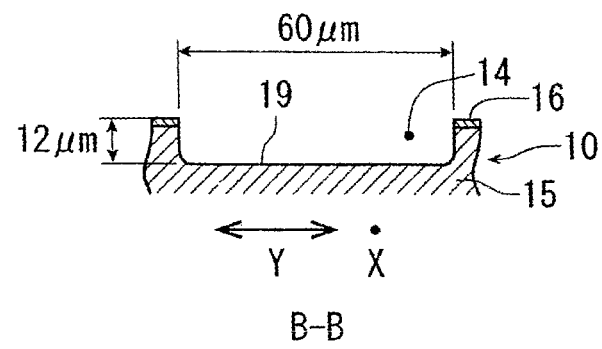
FIG. 5D is an enlarged cross-sectional view taken along a line B-B of FIG. 5C.

According to the present embodiment, each time the removing step is carried out, the spot P3 is moved 1 μm in the direction indicated by the arrow R5, and the spot P4 is moved 1 μm in the direction indicated by the arrow R6, thereby performing the expanding step of expanding a wafer region processed by the laser beams in the removing step, by 2 μm along the Y-axis. According to the present embodiment, the expanding step is repeated seven times while the removing step is repeated eight times such that each cycle of the expanding step is carried out between two cycles of the removing step. In this manner, the removing step is carried out eight times on one projected dicing line 14. The removing step and the expanding step are performed on all the projected dicing lines 14 on the face side 10*a* of the wafer 10 by actuating the laser beam applying unit 7, the X-axis moving mechanism 4*a*, the Y-axis moving mechanism 4*b*, and the rotating mechanism, not illustrated, for the chuck table 35, thereby forming grooves 19 in all the projected dicing lines 14 where the semiconductor substrate 15 is exposed, as illustrated in FIG. 5D. According to the present embodiment, the spots P3 and P4 form a groove 19 to a depth of 1.5 μm in the wafer 10 in one cycle of the removing step. Therefore, the groove 19 finally formed in each projected dicing line 14 has a width of 60 μm and a depth of 12 μm as illustrated in FIG. 5D. According to the present embodiment, since the width limiting groove forming step is carried out prior to the functional layer removing step, the grooves 19 are formed in the projected dicing lines 14 reliably across the width of 60 μm.

Laser processing conditions in the functional layer removing step are as follows, for example.

Figure 6:
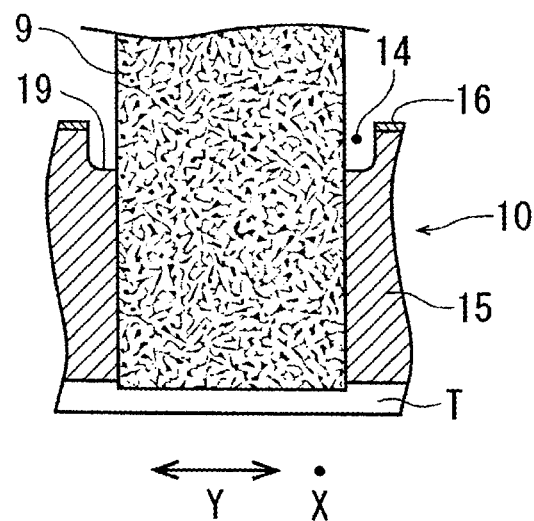
FIG. 6 is an enlarged fragmentary cross-sectional view illustrating the manner in which a device chip fabricating step of the method is carried out.
Figure 7:
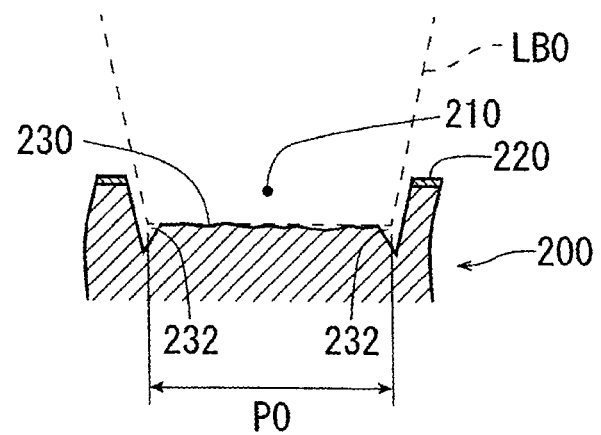
FIG. 7 is an enlarged fragmentary cross-sectional view illustrating the manner in which a functional layer is removed according to the prior art.

Wavelength: 355 nm
Repetitive frequency: 200 kHz
Average output level: 3.0 W
Pulse duration: 10 ps
Processing feed speed: 200 mm/s After the functional layer removing step has been carried out, the device chip fabricating step of fabricating individual device chips by cutting the wafer 10 along the projected dicing lines 14 where the semiconductor substrate 15 is exposed is carried out. The device chip fabricating step may be carried out by using a known dicing apparatus, not illustrated. For example, as illustrated in FIG. 6, the dicing apparatus has a cutting blade 9 with only its tip end portion being illustrated. The cutting blade 9 that is rotating at a high speed is positioned in the groove 19 formed in the wafer 10 along the projected dicing line 14 and is incising-fed to a depth large enough to fully sever the wafer 10 while the wafer 10 is processing-fed along the X-axis, thereby performing a cutting step to cut the wafer 10 along the projected dicing line 14. The cutting step is repetitively performed along the grooves 19 formed in the wafer 10 along all the projected dicing lines 14, dividing the wafer 10 into individual device chips. The device chip fabricating step according to the present embodiment is now completed. In this manner, the method of processing a wafer that includes the functional layer removing step and the device chip fabricating step comes to an end. According to the present invention, the device chip fabricating step is not necessarily limited to the use of the cutting blade 9 of the dicing apparatus, but may be carried out by either a laser beam applied to cut the wafer 10 along the projected dicing lines 14 or plasma etching performed to cut the wafer 10 along the projected dicing lines 14.

The wafer 10 on which the method of processing a wafer described above has been performed is delivered to a picking-up apparatus that performs a picking-up step or delivered to another processing apparatus while being housed in a wafer cassette.

The method of processing a wafer according to the present embodiment includes the expanding step of moving at least the two spots P3 and P4 in such a manner as to make the longer sides of the two spots P3 and P4 shifted in opposite directions transversely across the projected dicing line 14 at the time when the removing step is repetitively carried out. Therefore, the wafer region processed by the laser beams on the projected dicing line 14 is gradually expanded transversely across the projected dicing line 14, so that the wafer 10 is prevented from being too intensively processed and is evenly processed on both sides of the spots transversely across the projected dicing line 14, and hence is prevented from having deep ditches each having a downwardly pointed sharp lower end, on both sides of the projected dicing line 14. Consequently, the device chip fabricating step performed in the groove 19 does not lower the flexural strength and hence the quality of individual device chips to be produced from the wafer 10.

Further, the laser applying apparatus 1 according to the present embodiment is used as a laser applying apparatus for carrying out the functional layer removing step, to process the wafer 10 with the laser beams by gradually expanding the wafer region processed by the laser beams on the projected dicing line 14. The wafer 10 can easily be processed by the laser beams while being prevented from being too intensively processed and being evenly processed on both sides of the spots transversely across the projected dicing line 14, and hence is prevented from having deep ditches each having a downwardly pointed sharp lower end, on both sides of the projected dicing line 14. Consequently, the device chip fabricating step performed in the groove 19 does not lower the flexural strength and hence the quality of individual device chips to be produced from the wafer 10.

The present invention is not limited to the embodiment described above. In the method of processing a wafer according to the above embodiment, the width limiting groove forming step of forming two grooves 18*a* and 18*b* that limit the width of a projected dicing line 14 is carried out prior to the functional layer removing step. However, the width limiting groove forming step may be omitted. If the width limiting groove forming step is omitted, then the second beam route Q2 illustrated in FIG. 2 may be omitted, and the laser beam applying unit may include at least the laser oscillator 72, the beam condenser 71, the beam spot shaper 76*c* disposed between the laser oscillator 72 and the beam condenser 71, and the beam branching unit 79 out of the components illustrated in FIG. 2.

According to the above embodiment, in the functional layer removing step, the laser beam LB1 is introduced into the Wollaston prism 79*b* that branches the laser beam LB1 into the P-polarized laser beam LB1*a* and the S-polarized laser beam LB1*b* that are applied as the spots P3 and P4 to the functional layer 16 on the projected dicing line 14. However, the present invention is not limited to such details. According to the present invention, a diffractive optical element (DOE) may be disposed on the beam route between the second half-wave plate 79a and the Wollaston prism 79b to form a plurality of interference fringes, to thereby branch the laser beam LB1 into an increased number of laser beams, e.g., four laser beams applied as four spots or eight laser beams applied as eight spots. This arrangement makes it possible to process the wafer 10 more evenly with the laser beams on the projected dicing line 14.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer having a semiconductor substrate and a functional layer disposed on an upper surface of the semiconductor substrate, the wafer including a plurality of devices disposed in respective areas of the functional layer that are demarcated on a face side of the wafer by a plurality of intersecting projected dicing lines, to divide the wafer into individual device chips including the respective devices, the method comprising:

a functional layer removing step of removing the functional layer disposed on the projected dicing lines, thereby exposing the semiconductor substrate; and a device chip fabricating step of cutting the wafer along the projected dicing lines where the semiconductor substrate is exposed, thereby fabricating individual device chips, wherein the functional layer removing step includes a removing step of removing the functional layer by applying laser beams to the projected dicing lines with use of a laser applying apparatus that has a laser oscillator for emitting a laser beam, a beam condenser for condensing the laser beam emitted from the laser oscillator into a spot smaller than a width of the projected dicing lines and for positioning the spot on the projected dicing lines, a beam spot shaper disposed between the laser oscillator and the beam condenser and configured to shape the spot into a slender spot, and a beam branching unit for branching the slender spot into at least two slender spots spaced from each other in a processing direction along the projected dicing lines and for orienting longer sides of the slender spots transversely across the projected dicing lines and shorter sides of the slender spots in the processing direction, and an expanding step of expanding a wafer region processed by the laser beams, by moving the at least two slender spots from the beam branching unit in such a manner as to make the longer sides of the slender spots shifted in opposite directions transversely across the projected dicing lines, and the removing step and the expanding step are repetitively carried out to remove the functional layer on the projected dicing lines.

2. The method of processing a wafer according to claim 1, further comprising:

a width limiting groove forming step of, prior to the functional layer removing step, forming two grooves for limiting the width of the projected dicing lines, by applying the laser beams to the projected dicing lines.

3. The method of processing a wafer according to claim 2, further comprising:

a protective film coating step of, prior to the functional layer removing step and the width limiting groove forming step, coating the face side of the wafer with a protective film.

4. The method of processing a wafer according to claim 1, wherein the device chip fabricating step includes any one of a step of cutting the wafer along the projected dicing lines with a cutting blade, a step of cutting the wafer along the projected dicing lines with a laser beam, and a step of cutting the wafer along the projected dicing lines by plasma etching.

* * * * *